(12) United States Patent
Heigl

(10) Patent No.: US 6,860,740 B2
(45) Date of Patent: Mar. 1, 2005

(54) DEVICE AND METHOD FOR CONTACTING AT LEAST ONE TERMINAL OF AN ELECTRONIC ELEMENT

(76) Inventor: Helmuth Heigl, Anemonenweg 3 a, 83059 Kolbermoor (DE)

( * ) Notice: Subject to any disclaimer, the term of this patent is extended or adjusted under 35 U.S.C. 154(b) by 0 days.

(21) Appl. No.: 09/984,011

(22) Filed: Oct. 26, 2001

(65) Prior Publication Data

US 2002/0054483 A1 May 9, 2002

(30) Foreign Application Priority Data

Oct. 30, 2000 (DE) .......................................... 100 53 745

(51) Int. Cl.[7] .................................................. H01R 9/09
(52) U.S. Cl. ...................................................... 439/65
(58) Field of Search ................................ 324/754, 756, 324/761; 439/65, 66, 140, 141, 482, 260, 261, 265, 267

(56) References Cited

U.S. PATENT DOCUMENTS

| | | | | |
|---|---|---|---|---|
| 2,654,872 A | * | 10/1953 | Saul et al. ................... | 439/261 |
| 3,537,063 A | * | 10/1970 | Beaulieu .................... | 439/267 |
| 3,611,259 A | * | 10/1971 | Palecek ..................... | 439/267 |
| 3,793,609 A | * | 2/1974 | McIver ....................... | 439/267 |
| 4,076,362 A | * | 2/1978 | Ichimura .................... | 439/260 |
| 4,176,900 A | * | 12/1979 | Hines et al. ................ | 439/260 |
| 4,423,376 A | * | 12/1983 | Byrnes et al. .............. | 324/756 |
| 4,554,506 A | * | 11/1985 | Faure et al. ................ | 324/761 |
| 4,575,171 A | * | 3/1986 | Igarashi et al. ............. | 439/267 |
| 5,248,262 A | * | 9/1993 | Busacco et al. ............. | 439/66 |
| 5,320,559 A | * | 6/1994 | Uratsuji et al. ............. | 439/482 |
| 5,419,710 A | | 5/1995 | Pfaff | |
| 5,611,705 A | | 3/1997 | Pfaff | |
| 5,865,639 A | * | 2/1999 | Fuchigami et al. ......... | 439/330 |
| 6,050,836 A | * | 4/2000 | Tohyama .................... | 439/266 |
| 6,083,013 A | * | 7/2000 | Yamagishi ................... | 439/71 |
| 6,229,320 B1 | * | 5/2001 | Haseyama et al. .......... | 324/754 |
| 6,292,003 B1 | * | 9/2001 | Fredrickson et al. ........ | 324/754 |
| 6,438,831 B1 | * | 8/2002 | Hagihara ..................... | 29/884 |
| 6,492,826 B2 | * | 12/2002 | Hamren ...................... | 324/755 |

FOREIGN PATENT DOCUMENTS

| | | |
|---|---|---|
| DE | 19521137 | 12/1995 |
| DE | 19648421 | 7/1998 |

* cited by examiner

*Primary Examiner*—Thanh-Tam Le
(74) *Attorney, Agent, or Firm*—Stevens, Davis, Miller & Mosher, LLP (57) ABSTRACT

The present invention relates to a device and method for contacting one or more terminals (19) on an electronic component (18) including at least one elongated contact element (11). In this arrangement, one terminal (19) and a corresponding contact element (11) each can be pressed together in a first direction (16) by a contact force (F). The invention provides for elastically prestressing the contact element (11) in a second direction (26) differing from the first direction (16). To produce the prestress, a movable actuator (23) is used to advantage. In accordance with another aspect of the invention the lower end of the contact element is arranged non-shiftable whilst the second end is shifted by the actuator (23) for contacting. In both cases, a compact contacting device (10) is provided which maintains the desired contact force (F) accurately and features a long life due to the contact elements (11) being prestressed.

24 Claims, 10 Drawing Sheets

DEVICE AND METHOD FOR CONTACTING AT LEAST ONE TERMINAL OF AN ELECTRONIC ELEMENT

The present invention relates to a device for contacting one or more terminals on an electronic component including at least one elongated contact element, involving one terminal and a corresponding contact element being pressed together in a first direction and a contact force being exerted on the contact element in the first direction. The invention relates furthermore to a method for contacting one or more terminals on an electronic component including at least one elongated contact element, involving a relative movement between a terminal to be contacted and a corresponding contact element in a first direction.

One such device and one such method are known, for example, from DE 196 48 421 C1 of the same assignee. For this known method of contacting, contact elements, arranged paired, are provided which cooperate with each other pincer-like and are defined on counter-rotating spindles. In this arrangement, the one contact element engages from the upper side and the other from the underside a corresponding terminal of the electronic component. It is this arrangement that prevents the terminals bending out of place during contacting and in subsequent testing of the component.

In this contacting device, as well as in other known contacting devices, a certain contact force is needed between the contact element and the corresponding terminal of the electronic component. The lower the contact force, the higher is the electrical contact resistance between the contact element and the terminal. As soon as the contact force drops below a critical value, the contact resistance may become so high that reliable testing of the component is no longer possible. At the same time, assembly or fabrication tolerances of the contacting device or of the component must not result in a prohibitively high increase in the contact force, otherwise there is a risk of the component or contacting device being damaged.

The electronic components for testing are being continually downsized. In addition to a reduction in the surface area of the terminals this also results in a reduction in the spacing between the terminals. This is why the contact elements likewise need to be configured increasingly smaller and arranged with less spacing from each other in the contacting device. Despite this reduction in size and spacing, high fabrication and assembly tolerances need to be maintained.

Contacting and testing electronic components is being continually speeded up. Some contacting devices can test up to 15,000 components per hour. The life of contact elements used hitherto is, however, restricted to approx. 180,000 to 200,000 contactings. The reason for this is that known contact elements are always loaded from the zero load condition up to the contact force and subsequently totally relieved of load. In this disadvantageous loading arrangement, serious microchanges occur in the grain structure which result in failure after a relatively low number of load cycles and thus in reduced life. In actual practice, the contacting device thus needs to be changed and reset once or twice daily, resulting in substantial downtime and correspondingly high time and cost expenditure.

It is thus the objective of the present invention to provide a device and a method for contacting which is compact and permits fast contacting with only minor deviations from the desired contact force whilst featuring a long life.

In accordance with the invention, this objective is achieved by a device of the aforementioned kind in that the contact element can be prestressed elastically in a second direction deviating from the first direction. To achieve this objective the method in accordance with the invention provides for each contact element, before contacting, being prestressed elastically in a second direction deviating from the first direction. In this arrangement, the second direction is oriented substantially perpendicular to the first direction. On being actuated, the contact element is now deformed by the contact force substantially perpendicular to the first direction, it thus being good practice to prestress the contact element in this direction right from the start.

Prestressing the contact element in the second direction as provided for in accordance with the invention achieves a number of advantages. Firstly, prestressing results in the force needed for deforming the contact element being increased. As soon as the terminal and the contact element are pressed against each other, the contact element remains undeformed until the contact force exceeds the prestress. Accordingly, a relatively high contact force can now be achieved with downsized contact elements.

Due to prestressing, there is now no need to extensively deform the contact element to attain the contact force. Instead, a minimum deformation is sufficient to attain a relatively high contact force. The distance to be covered by the component being tested or by the contact element is minimized in thus enabling contacting to be speeded up.

Furthermore, due to prestressing, the contact element is now continuously subjected to a certain stress which is increased during contacting before returning to the prestress value at the end of testing. The contact element is no longer totally relieved of load. Loading the contact element in this way results in only minor microchanges in the grain structure of the contact element in thus substantially increasing the number of load cycles up to failure of the contact element.

Advantageous aspects and further embodiments of the invention read from the sub-claims.

In accordance with one advantageous aspect of the invention a first end of the contact element is arranged non-shiftable and a second end can be shifted by an actuator for contacting. The method in accordance with the invention provides for a further embodiment in that a first end of the contact element is clamped in place non-shiftable and a second end is moved for contacting.

In this aspect, deformation of the contact element for contacting is provided for. Deforming is done to advantage elastically by means of one or more actuators. In this procedure the desired contact force can be precisely maintained. It is particularly of advantage when the contact element is elastically prestressed as described above and is further deformed for contacting. In this procedure the additional advantages as described above are achievable.

The contact elements are advantageously configured in one piece in the form of a continuous rod. There is no need to use multi-part contact elements or contact elements coiled like springs. This thus permits downsizing the contact elements with high accuracy.

To advantage the first direction is oriented substantially parallel to the longitudinal centerline of the contact element. The contact element is then subjected to both bending and buckling in contacting so that a high contact force is achievable for minor deformation of the contact element.

For prestressing the at least one contact element an actuator is used to advantage. In this arrangement, a separate actuator may be provided for each contact element. The contact elements can also be grouped together into several arrays, a common actuator then being assigned to each array of contact elements. In this procedure, the prestress can be set individually or for the array. As an alternative, all contact elements may be assigned a common actuator in simplifying the design.

In accordance with one advantageous further embodiment, the actuator is movable, more particularly rotatable or shiftable. Being able to move the actuator permits varying the prestress. The contacting device in accordance with the invention can then be adapted to a variety of components to be tested.

In one advantageous aspect, the actuator is arranged on roughly half the length of the contact element. This results in the contact element being subjected to the prestress uniformly.

In a first advantageous further embodiment, the actuator comprises a contact surface area arranged at its outer circumference for coming into contact with the contact element. The outer circumference of the actuator can be machined to high accuracy by simple means so that the desired prestress is reliably maintained.

In accordance with a first aspect, the actuator comprises a non-round, more particularly, elliptical cross-section and is rotatable for altering the prestress in enabling it to be disposed between the contact elements elastically prestressed thereby, i.e. enabling one or more contact elements to be prestressed by rotating the actuator.

In accordance with a second advantageous aspect, the actuator comprises a round cross-section and is shiftable for varying the prestress, the corresponding contact element(s) then being arranged on one side of the actuator.

In accordance with a second advantageous further embodiment, the actuator comprises one or more apertures through which the contact element(s) protrude for prestressing. By shifting the actuator in the second direction, uniform prestressing of all corresponding contact elements is thus achievable. More particularly, a plurality of contact elements can be uniformly prestressed with just one actuator.

In this arrangement, a separate aperture may be provided for each contact element to be prestressed. As an alternative, several contact elements may protrude through a common aperture. In the first case, optimum guidance is achieved for each contact element to be prestressed. The second aspect simplifies production of the actuator.

To advantage, the shape of the aperture is adapted to the cross-section of the contact element. More particularly, the aperture may be configured as a circle, as an oval, as a slot or slit. Correspondingly, the contact element may comprise a substantially round or oval or a substantially polygonal, more particularly, rectangular cross-section. Adapting the shape of the aperture to the cross-section of the contact element results in optimum guidance both during prestressing as well as during contacting and testing.

The cross-section of the contact element in this arrangement is selected depending on the boundary conditions. When using a round cross-section the contact element can be prestressed in principle in any direction perpendicular to its longitudinal centerline. When using a non-rotationally symmetrical, more particularly rectangular cross-section the contact element is prestressed to advantage in a direction parallel to the its narrow sides in then enabling guidance in a direction parallel to the longitudinal sides of the contact element to be eliminated.

To advantage, the contact element is clamped in place non-shiftable by its first end and guided by its second end in a mount. In this arrangement, the mount provides guidance parallel to the longitudinal centerline of the contact element. The first end of the contact element is then connected to a suitable circuit board for communicating the electrical signals needed for testing the component. This connection can be made simply by this end being clamped in place non-shiftably, the second end serving to contact a terminal of the component.

In this arrangement, the first end may be secured articulatedly or rigidly located. When secured articulatedly, the contact element can be deformed with little force, resulting in less prestress for the same deflection by the actuator. If a higher prestress is desired, the contact element is rigidly located at its first end and prevented from twisting out of place. For the same deflection of the contact element as in the first case a higher prestress is then achieved. When the first end is rigidly located, shifting the second end also results in a higher increase in the contact force.

In another advantageous further embodiment the mount is tapered towards the second end of the contact element in thus providing at an upper side of the mount a substantially continuous surface area having only small openings. Starting from the upper side to the first end of the contact element the mount is flared. This attains reliable guidance of the contact element whilst simultaneeously preventing it from tilting out of place.

In accordance with yet another advantageous further embodiment the second end of the contact element in a first elastically prestressed condition protrudes beyond an upper side of the mount and is furthermore elastically deformable and movable under the upper side by a movement of the corresponding actuator. It is thus possible by varying the prestress of the contact element to move the end serving contacting in a first direction. The relative movement between the contact element and component as needed for contacting can thus be achieved in accordance with the invention by altering the prestress of the contact element. Moving the component is then no longer necessary.

For contacting one or more terminals the prestress of the corresponding contact elements is firstly increased to such an extent that their ends are moved under the upper side of the mount on which the electronic component is shiftably mounted. Then, the component is moved into a contacting position on the mount, after which the prestress of the contact elements is reduced to such an extent that their ends are urged against the terminal(s) of the component. On completion of contacting, the prestress of the contact elements is increased, resulting in the ends thereof again being moved under the upper side. The tested component is then removed and replaced by a further component in the contacting position on the mount.

For this contacting system a full-length rail for transporting the components to be tested can be put to use, eliminating the need for a separate carriage for feeding the components to the contacting device.

The invention will now be detailed by way of example embodiments as shown diagrammatically in the drawing, in which like components are identified like reference numerals throughout and in which.

Figure 1:
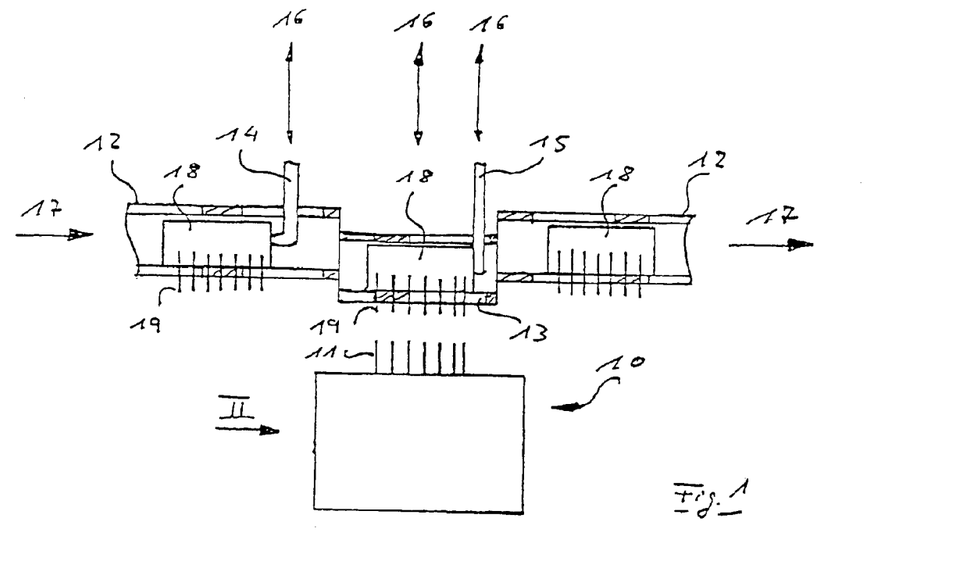
FIG. 1 is a diagrammatic side view of a pick-and-contacting device.

Referring now to FIG. 1, there is illustrated a side view of a contacting device 10 in accordance with the invention including several contact elements 11 arranged below a rail 12 and a carriage 13. Engaging the rail 12 are two stops 14, 15 adjustable in the direction of the arrow 16, the carriage 13 too, being movable in the direction of the arrow 16. With the rail 12 the components 18 having a series of terminals 19 are conveyed in the direction of the arrow 17, the number of terminals 19 corresponding to the number of contact elements 11.

For contacting and testing, the components 18 need to be picked. The first stop 14 serves to halt the components 18 guided in the left-hand half of the rail 12. The second stop 15 dictates a defined contacting position for the component 18 to be tested in the carriage 13. Once the component 18 has assumed this contacting position, the carriage 13 is run in the direction of the arrow 16 up to the contacting device 10. The contact elements 11 and terminals 19 in this arrangement are pressed together with a contact force. The contact elements 11 then receive one or more electrical signals serving to test the component 18. On completion of testing, the carriage 13 is returned to its topmost position in line with the rail 12. The stop 15 is lifted in the direction of the arrow 16 and the tested component 18 is conveyed further in the direction of the arrow 17 by the rail 12.

Figure 2:
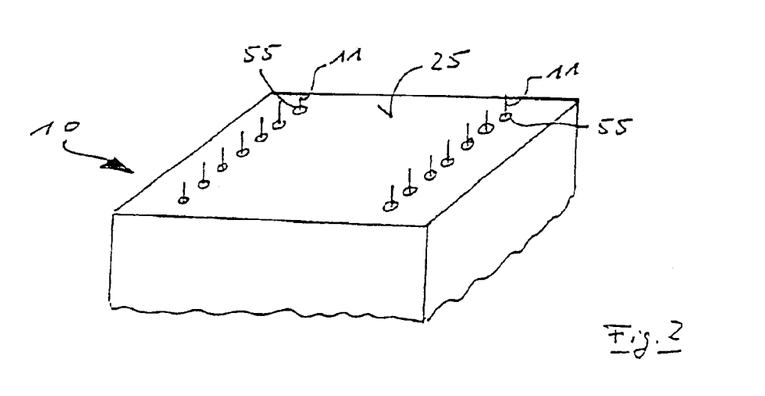
FIG. 2 is a diagrammatic view in perspective of a contacting device in the direction of the arrow 11 as shown in FIG. 1.

Referring now to FIG. 2, there is illustrated in a diagrammatic view in perspective the contacting device 10 as shown in FIG. 1. In the example embodiment as shown, the contact elements 11 are arranged in two rows in parallel. In this arrangement, the upper ends of the contact elements 11 protrude beyond the upper side 25 of the contacting device 10 through mounts 55.

Figure 3:
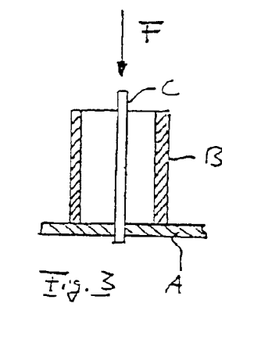
FIG. 3 is a section taken through a prior art contact element in the zero load condition.
Figure 4:
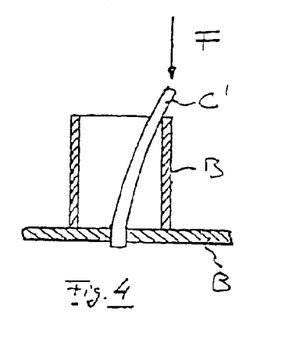
FIG. 4 is a view similar to that of FIG. 3 illustrating the loading limit of the contact element being exceeded.

Referring now to FIGS. 3 and 4, there is illustrated a section through a prior art contact element in the zero load condition and with the loading limit exceeded. Arranged on a circuit board A are a receptacle B and an elongated contact element C substantially concentric to the receptacle. The contact element C is fixedly clamped in place non-shiftable in the circuit board A. As soon as a contact force F is exerted from above on the contact element C initially only an unsubstantial compression of the contact element occurs, but once the critical force is exceeded, the contact element quickly buckles into its position C' as shown in the Figure, this being the first Euler's formula. The critical force $F_K$ is then given by $$F_K = \pi^2 E I_y / (4L^2)$$

where
E: module of elasticity
$I_y$: moment of inertia
L: length of contact element C above board A.

Exceeding the permissible buckling force $F_K$ by one percent already results in a lateral deflection of 9 percent of the length L of the contact element C (cf. W. Beitz, K.-H. Küttner, "Dubbel, Taschenbuch für den Maschinenbau", 16$^{th}$ Edition 1987, Springer Verlag, page C42).

Figure 5:
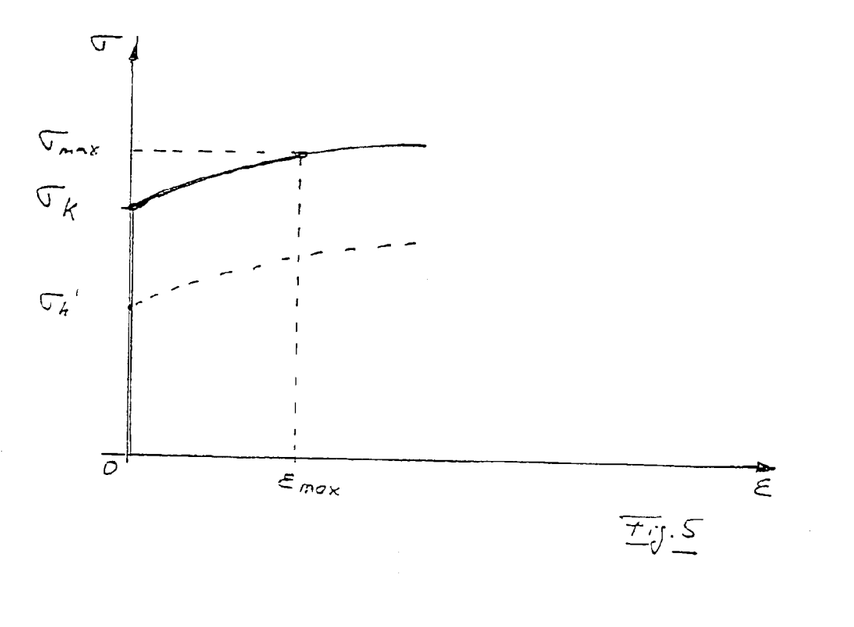
FIG. 5 is a stress-strain diagram of a contact element as shown in FIG. 3.

Referring now to FIG. 5, there is illustrated the stress-strain diagram of the known contact element C during deformation. Initially only an increase in the stress σ up to the buckling stress $\sigma_k$ occurs with no substantial deformation ε. Once the buckling stress $\sigma_k$ is exceeded the contact element C is deformed until maximum deformation $\epsilon_{max}$ is attained. Here too, the stress attains its maximum value $\sigma_{max}$. The contact element C is thus continuously deflected from its resting position up to the maximum stress $\sigma_{max}$ and to maximum deformation $\sigma_{max}$ before then returning to the zero load condition.

Loading in this way, followed by a complete return to zero load, results in serious microchanges in the grain structure of the contact element C. The number of possible load cycles and thus the life is greatly restricted. Further slight deviations in length and cross-section of the contact element C produce a significant change in the buckling force $F_K$. This is illustrated diagrammatically in FIG. 5 by the broken lines, starting from the changed buckling stress $\sigma_k'$. Due to the fabrication and assembly tolerances the deformation of the contact element C occurs undefined earlier or later. This results in fluctuations in the contact force between the contact element C and the corresponding terminal 19 of the component 18 being tested.

Figure 6:
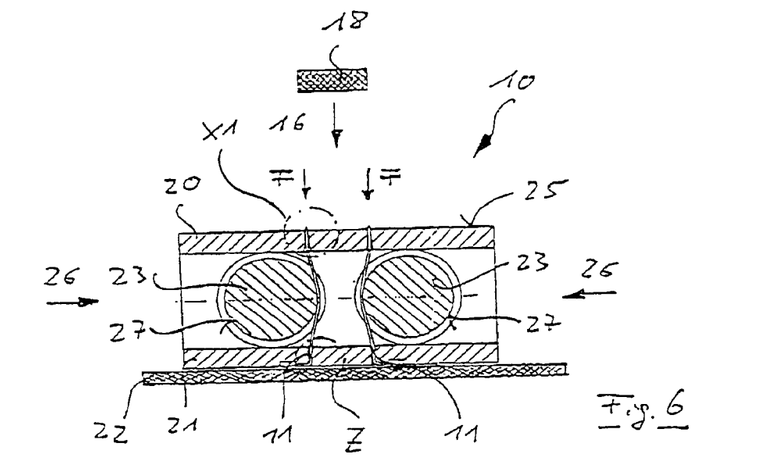
FIG. 6 is a diagrammatic sectional view of the basic principle of the contacting device in accordance with the invention.

Referring now to FIG. 6, there is illustrated a diagrammatic section view of the contacting device 10 in accordance with the invention. Evident are two contact elements 11 mounted between an upper part 20 and a lower part 21 of the contacting device 10. The lower ends of the contact elements 11 come into contact with a circuit board 22. Via the board 22 and the contact elements 11 electrical signals can be communicated to the terminals 19 of the component 18 illustrated diagrammatically.

Arranged furthermore between the upper part 20 and the board 22 are two round actuators 23. These actuators 23 comprise at their outer circumference a contact surface area 27 designed to come into contact with the contact elements 11. The actuators 23 are shiftable in the direction of the arrow 26 and in the direction opposite thereto. The contact elements 11 can thus be elastically prestressed in this direction of the arrow 26. In accordance with one example embodiment of the invention the prestress is selected so that the contact elements 11 protrude beyond an upper side 25 of the upper part 20.

A component to be tested is supplied in the direction of the arrow 16 and exerts a contact force F on the contact elements 11. The direction of the contact force F in this arrangement runs substantially parallel to the longitudinal centerline of the contact elements 11 and perpendicular to the prestressing direction 26.

Figure 7:
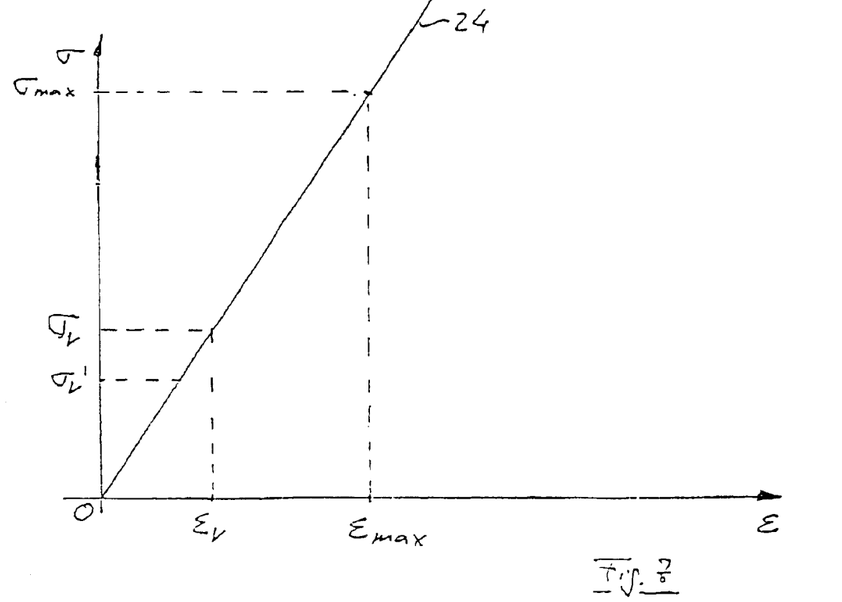
FIG. 7 is a stress-strain diagram of a contact element in accordance with the invention.

Referring now to FIG. 7, there is illustrated the stress-strain diagram of a contact element 11 of the contacting device 10 in accordance with the invention. Due to the elastic prestress an initial stress $\sigma_v$ and an initial deformation $\epsilon_v$ is always present. Due to the contact force F the contact element is further deformed elastically up to the maximum stress $\sigma_{max}$ and maximum deformation $\epsilon_{max}$. As soon as the contact force F is removed stress and strain return to the initial values $\sigma_v$, $\epsilon_v$.

Total relief of the load on the contact elements 11 does not take place, it instead continuously being subjected to stress. In this loaded condition only minor microchanges occur in the grain structure of the contact elements 11 in thus significantly increasing the life and number of load cycles until failure.

Furthermore, the contact element 11 is always in a condition of elastic deformation. In this condition Hooke's Law $\sigma=E*\epsilon$ applies as is evident from the straight line 24 in FIG. 7. This straight line 24 indicates a material property of the contact element 11 which is independent of the fabrication and assembly tolerances of the contact element 11. This is why even when differences exist between the individually contact elements 11 the straight line 24 still defines how the $\sigma$ relates to the deformation $\epsilon$. This is in turn again evident, for example, by the change in the prestress $\sigma_v$' which merely results in a shift on the straight line. The linear relationship between stress $\sigma$ and deformation $\epsilon$ is in any case provided.

A further advantage of the contacting device 10 in accordance with the invention lies in the fact that for producing a relatively high contact force F only a small deformation $\epsilon$ of the contact elements 11 is needed. The reason for this is that the contact elements 11 are elastically prestressed in the direction of the arrow 26 perpendicular to the contact force F. It is due to this prestress that the contact elements 11 are already stressed which is furthermore intensified by the application of the contact force F. By suitable increasing the prestress it is thus possible to attain a high contact force F for small deformations $\epsilon$. The movement required for feeding the component 18 for contacting and for applying the desired contact force F can thus be minimized. It is this minimization that accelerates the contacting and testing sequence.

Figure 8:
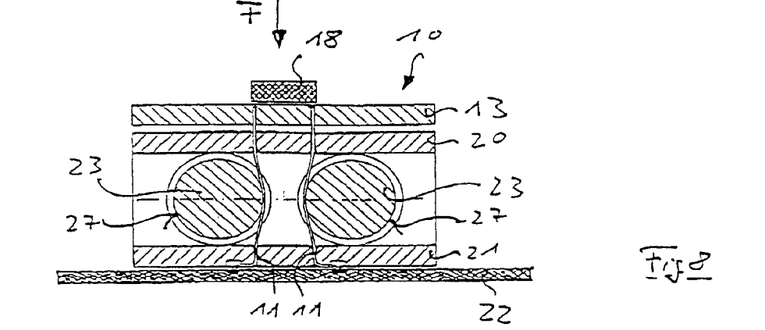
FIGS. 8 and 9 illustrate the sequence in contacting for a first aspect of the contacting device in accordance with the invention.
Figure 9:
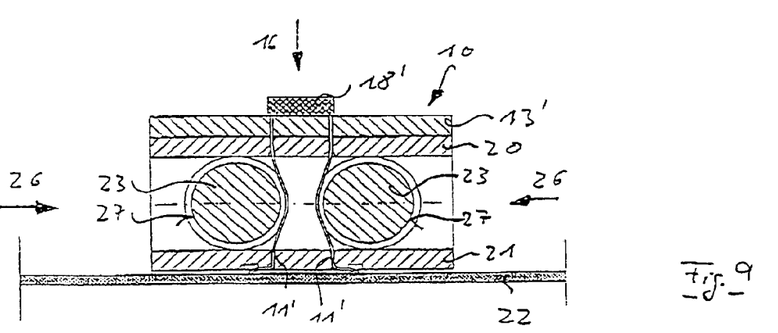

Referring now to FIGS. 8 and 9, there is illustrated the start in contacting in the first aspect of the contacting device in accordance with the invention as shown in FIG. 1. The contact elements 11 are prestressed by the shiftable actuators 23 in the direction of the arrow 26 perpendicular to the contact force F. Subsequently, the carriage 13 together with the components 18 to be tested is run in the direction of the arrow 16 downwards, the terminals of the components 18 coming into contact with the upper ends of the contact elements 11 to which they are pressed by the contact force F. The contact force F results in the contact elements 11 being lifted from the contact surface area 27 of the actuators 23. The changed positions as compared to those of FIG. 8 are each depicted as carriage 13, component 18 and contact elements 11'.

On completion of testing, the carriage 13 is run in the direction opposite to the direction of the arrow 16 upwards. This results in the contact elements 11 being relieved of load and returned to their position as shown in FIG. 8. Subsequently, a further component 18 to be tested is brought into the contacting position and the procedure is repeated.

Figure 10:
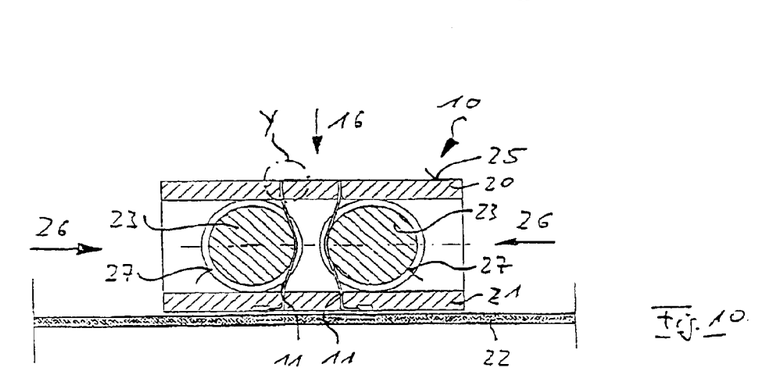
FIGS. 10 and 11 illustrate the sequence in contacting for a second aspect of the contacting device in accordance with the invention.
Figure 11:
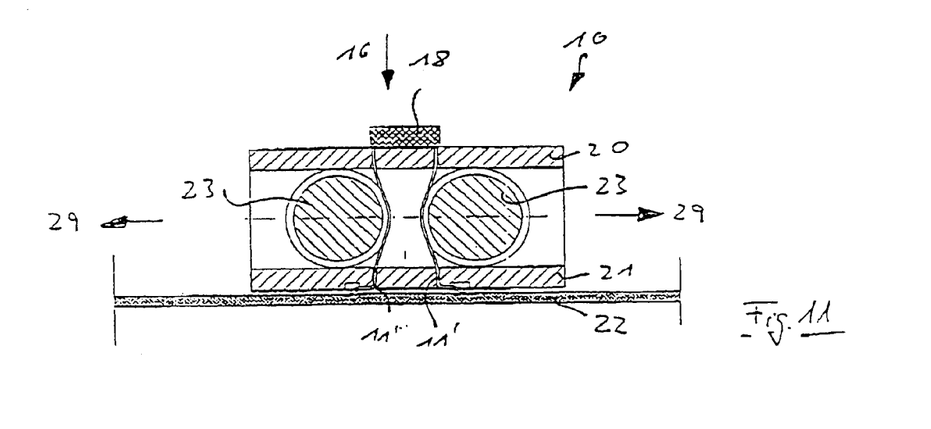

Referring now to FIGS. 10 and 11 there is illustrated the sequence in contacting for a second aspect of the contacting device 10 in accordance with the invention. In this aspect it is provided for that the contact elements 11 are initially prestressed such that they no longer protrude beyond the upper side 25 of the upper part 20. For this purpose the actuators 23 are moved towards each other in the direction of the arrow 26. Subsequently, a component 18 to be tested is brought into the contacting position. The actuators 23 are run outwards in the direction of the arrow 29, causing the prestress of the contact elements 11 to be changed. The upper ends of the contact elements 11 are then urged against the corresponding terminals of the component 18. On completion of contacting, the prestress of the contact elements 11 is again increased by the actuators 23 being moved inwards in the direction of the arrow 26. The upper ends of the contact elements 11 are then again moved below the upper side 25 of the upper part 20 so that the components 18 can be removed. For contacting and testing a further component 18 the procedure is repeated.

This aspect of the invention provides for the lower end of the contact elements 11 being arranged non-shiftable and the upper end is shiftable by the actuators 23 for contacting. In this arrangement, shifting is achieved by altering the prestress of the contact elements 11 by means of the actuators 23.

Figure 12:
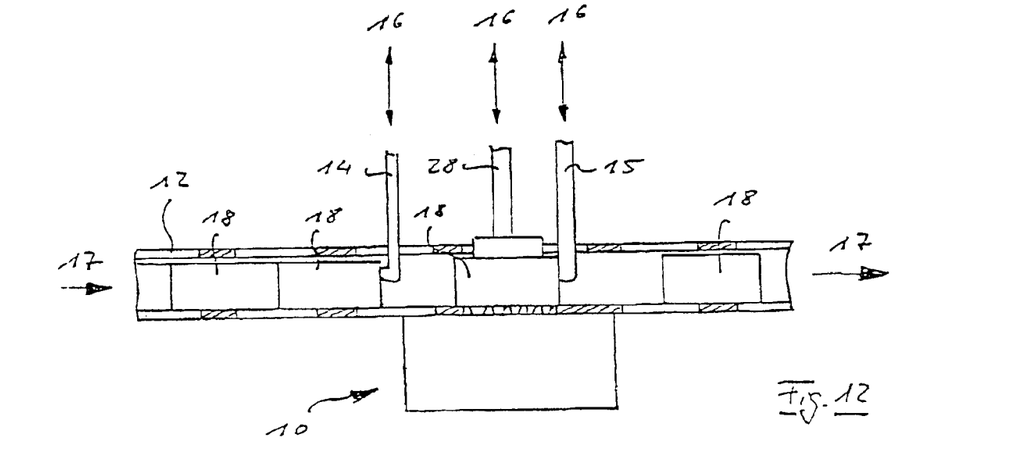
FIG. 12 is a view similar to that of FIG. 1 with the contacting device as shown in FIGS. 10 and 11.

Referring now to FIG. 12, there is illustrated one advantageous application of the contacting device 10 as shown in FIGS. 10 and 11. Here, the carriage 13 as shown in FIG. 1 can be eliminated since the necessary relative movement between the terminals of the components 18 and the contact elements 11 is produced by moving the upper ends of the contact elements 11 in thus permitting use of a full-length rail 12.

To increase the accuracy, a punch 28 is provided in the example embodiment shown for locating a component 18 in the contacting position. This punch 28 can be eliminated when the tolerances on the dimensions of the rail 12 are correspondingly accurate. To avoid tedious repetition, reference is made to the comments as made above as regards FIG. 1 for a description of the further elements.

Figure 13:
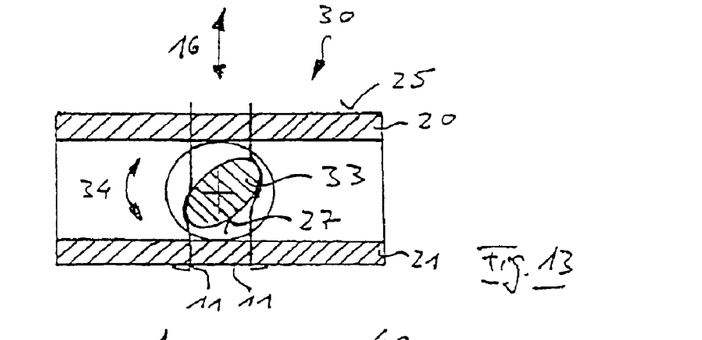
FIGS. 13 and 14 are section views of further aspects of a contacting device in accordance with the invention.

Referring now to FIG. 13, there is illustrated a cross-section through a third aspect of a contacting device 30 in accordance with the invention. In this case an actuator 33 is provided, featuring an elliptical cross-section which is rotatable for altering the prestress of contact elements in the direction of the arrow 34. The actuator 33 is disposed between the contact elements 11 prestressed elastically thereby. The contacting device 30 requires only a single actuator 33 for prestressing both rows of contact elements 11, whereas in the aspects as shown in FIGS. 8 to 11 a separate actuator 23 is provided for each row of contact elements 11.

Figure 14:
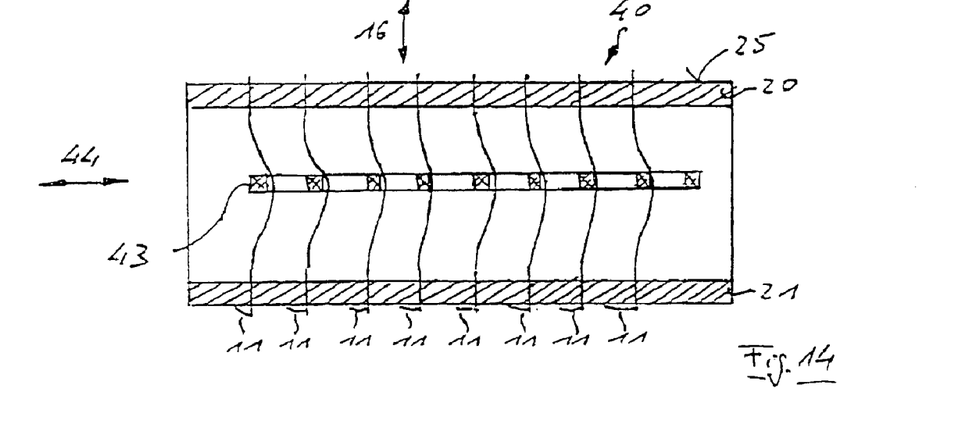

Referring now to FIG. 14, there is illustrated in a longitudinal section a fourth aspect of a contacting device 40 in accordance with the invention. For prestressing the contact elements 11 a sole substantially plate-shaped actuator 43 shiftable in the direction of the arrow 44 is used. The actuator 43 is arranged roughly at half the length of the contact elements 11. In this arrangement the direction 44 is oriented parallel to the conveying direction 17 of the components 18 by the rail 12 whilst the direction 26 stands perpendicular thereto.

Figure 15:
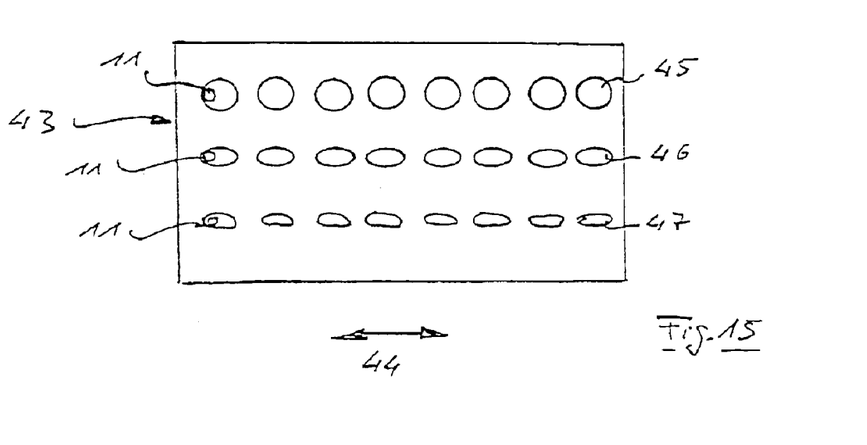
FIGS. 15 to 17 is a plan view of various aspects of the actuator as shown in FIG. 14.
Figure 16:
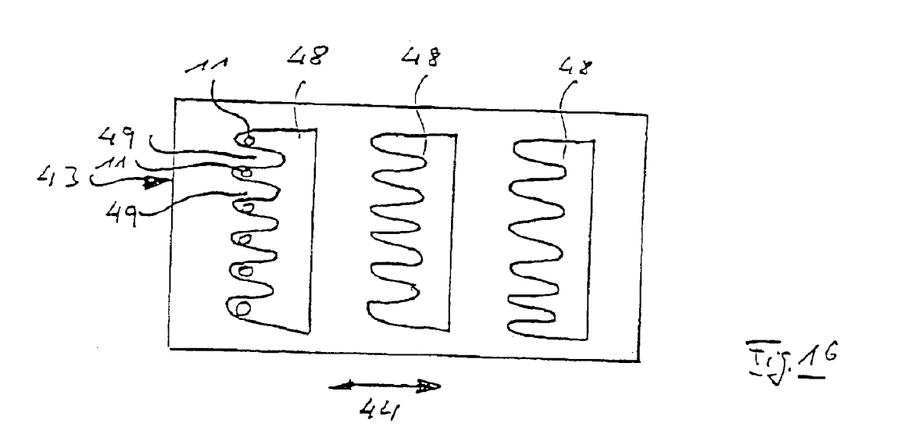
Figure 17:
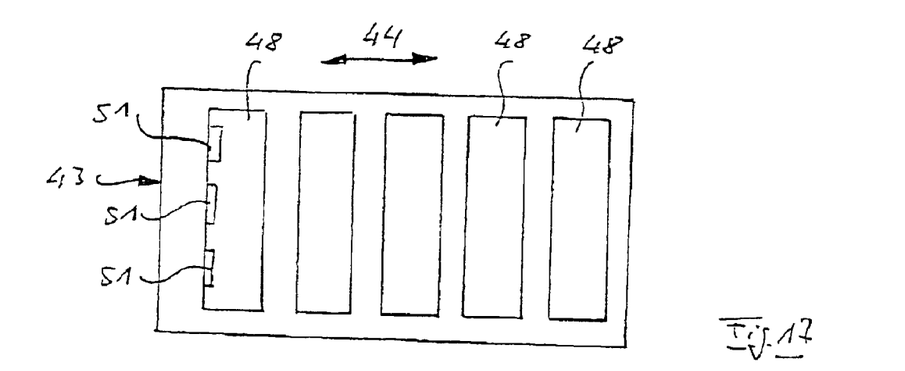

Referring now to FIGS. 15 to 17, there is illustrated a plan view of various aspects of the actuator 43. In FIG. 15 three rows of apertures 45, 46, 47 in the form of circles, ovals or slots are provided. For each contact element 11 a separate aperture 45, 46, 47 is provided through which the contact element 11 to be prestressed protrudes. The shape of the apertures 45, 46, 47 in this arrangement is adapted to the cross-section of the contact element 11.

Referring now to FIG. 16, there is illustrated an aspect in which several apertures 48 are provided in the form of slits located parallel to each other. To prevent the contact elements 11 from coming into contact with each other, fingers 49 protrude between two each contact elements 11 into the apertures 48.

Referring now to FIG. 17, there is illustrated yet another aspect of the actuator 43 including apertures 48 in the form of rectangular slits. Each aperture 48 is penetrated in the example embodiment shown by three contact elements 51 of rectangular cross-section.

The shape of the apertures 45, 46, 47, 48 is expediently adapted to the cross-section of each contact element 11, 51 employed. This is evident, for example, by way of the apertures 45, 46, 47 in FIG. 15 and the apertures 48 in FIG. 17.

Figure 18:
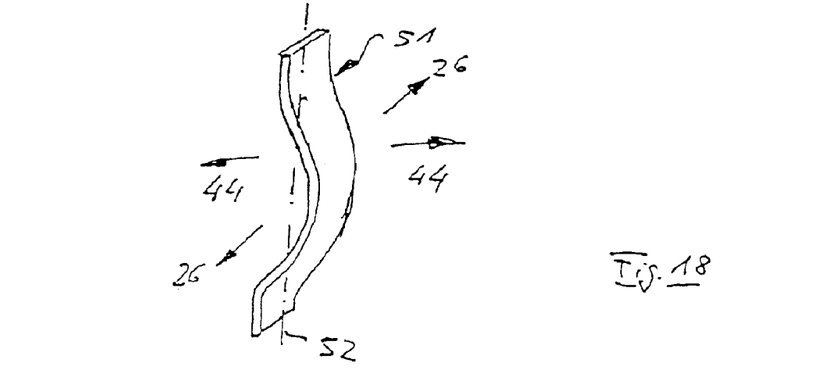
FIG. 18 is a diagrammatic view in perspective of a contact element.

Referring now to FIG. 18, there is illustrated diagrammatically a view in perspective of the contact element 51 of rectangular cross-section. For a better appreciation, the contact element 51 is illustrated in the elastically prestressed condition. When exposed to the contact force F, the contact element 51 is deformed only in the direction of the arrow 44 parallel to the narrow sides of the contact element 51, prestressing occuring, of course, in the same direction.

In operation, no deformation of the contact element 51 occurs in the direction 26 due to the rectangular cross-section, thus eliminating the need for a separate guidance at the actuator 43 which excludes any deformation in the direction 26. By suitably selecting the cross-section of the contact element 11 , 51 the lateral spacing between the individual contact elements 11, 51 can thus be reduced.

Figure 19:
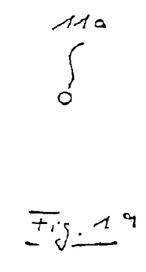
FIGS. 19 to 23 illustrate various cross-sections of the contact elements employed.
Figure 20:
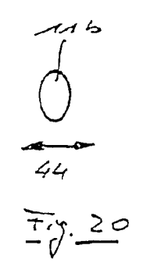
Figure 21:
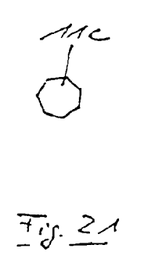
Figure 22:
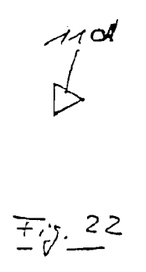

Referring now to FIGS. 19 to 23, there is illustrated in each case a different cross-section as possible for the contact elements. FIG. 19 shows a contact element 11a having a round cross-section which can be prestressed in all directions. In the case of the oval contact element 11b as shown in FIG. 20 elastic prestressing occurs to good effect in the direction of the arrow 44. To increase the prestress and the contact force F, prestressing may also occur, however, in the direction 26 perpendicular thereto. The contact elements 11c, 11d as shown in FIGS. 21 and 22 comprise a polygonal cross-section. These contact elements 11c, 11d may be used for special cases in which this polygonal cross-section provides, for example, a lateral contact surface area for guiding the contact elements 11c, 11d. FIG. 23 again depicts diagrammatically the rectangular cross-section of the contact element 51.

Figure 23:
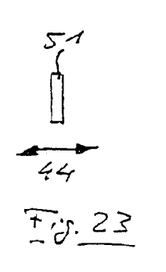

In addition to deformation and prestressing differing, the cross-section of the contact elements 11, 51 may also be selected as a function of the testing conditions for the component 18. The cross-sectional surface area of the contact element 51 is significantly larger than that of the contact element 11a, this being the reason why the electrical resistance of the contact element 51 is less. The contact element 51 can thus be put to use for testing with higher current values and higher frequencies than for the contact element 11a.

For contacting a relatively small terminal pad on the component 18 to be tested, the contact elements 11, 51 can be furnished with a tip provided at the end intended for contacting. This tip permits pin-point accurate contacting whilst making a large cross-sectional surface area of the contact element 11, 51 possible.

Figure 24:
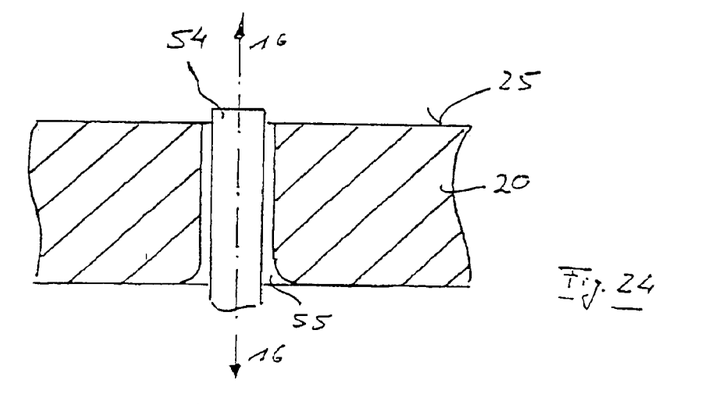
FIG. 24 is a magnified detail X1 as shown in FIG. 5.
Figure 25:
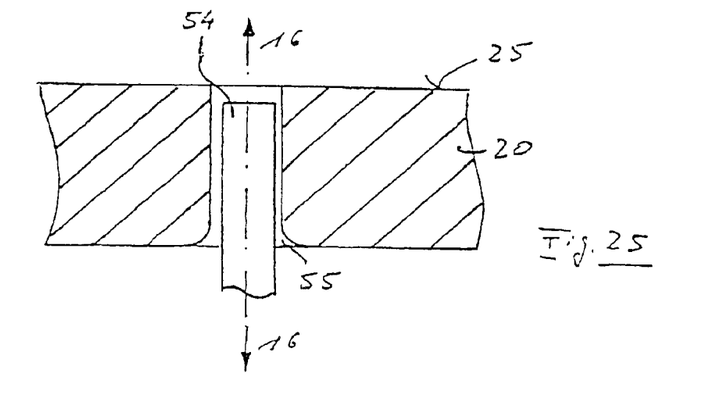
FIG. 25 is a magnified detail Y as shown in FIG. 10.
Figure 26:
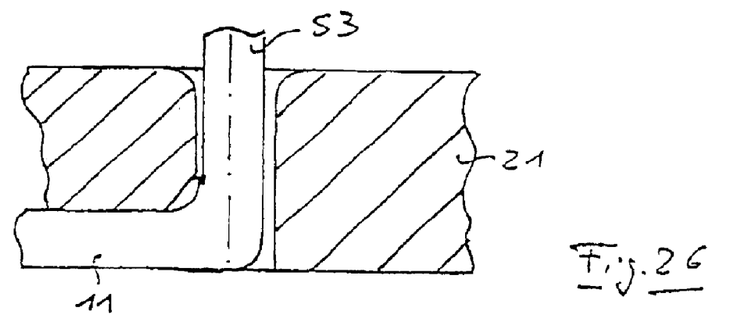
FIG. 26 is a magnified detail Z as shown in FIG. 5 in a first aspect.
Figure 27:
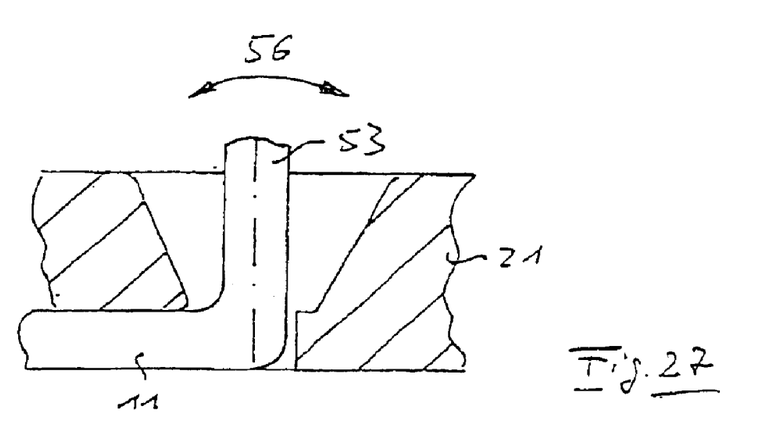
FIG. 27 is a magnified detail Z as shown in FIG. 5 in a second aspect.

Referring now to FIGS. 24 and 25, there is illustrated in a magnified detail the mount 55 in the upper part 20. Shiftingly guided in the mount 55 is an upper end 54 of the contact element 11 in the direction of the arrow 16. The mount 55 comprises a somewhat larger diameter than the end 54 of the contact element. To prevent tilting, the mount 55 is flared downwards to the other end of the contact element In the aspect as shown in FIG. 24, the end 54 protrudes beyond the upper side 25 of the upper part 20. This is why for contacting, a component 18 to be tested needs to be placed from above in the direction of the arrow 16 on the upper side, whereas in the aspect as shown in FIG. 25 the upper end 54 is retracted below the upper side 25. This enables a component 18 being tested to be simply shifted on the upper side 25 without requiring any movement of the component 18 in the direction of the arrow 16. As soon as the component 18 has assumed the desired contacting position, the prestress of the contact elements 11 is reduced. Due to this reduction in the prestress the ends 54 are moved upwards towards the upper side 25 and come into contact with the terminals of the component 18 to be tested. FIGS. 26 and 27 show in magnified detail how a lower end 53 of the contact elements 11 is clamped in place. In the aspect as shown in FIG. 26 the lower end 53 is clamped in place non-shiftable and rigidly located, whereas in the aspect as shown in FIG. 27 the contact element 11 can be moved articulatedly in the direction of the arrow 56 whilst being clamped in place non-shiftable.

In the aspect as shown in FIG. 26 this rigid location permits attaining higher prestressing than in the aspect as shown in FIG. 27. Depending on the dimensions of the contact elements 11 and the desired contact force, either the aspect as shown in FIG. 26 or that as shown in FIG. 27 is selected.

Figure 28:
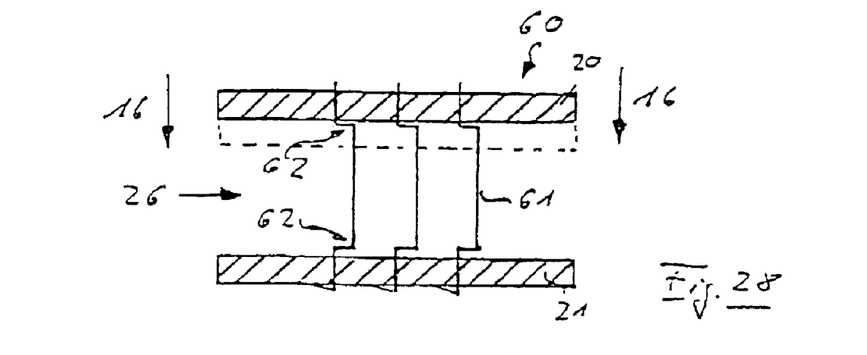
FIGS. 28 and 29 is a cross-section through a further aspect of a contacting device in accordance with the invention.
Figure 29:
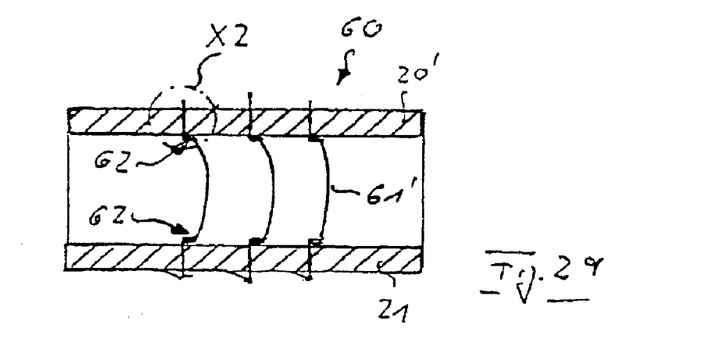
Figure 30:
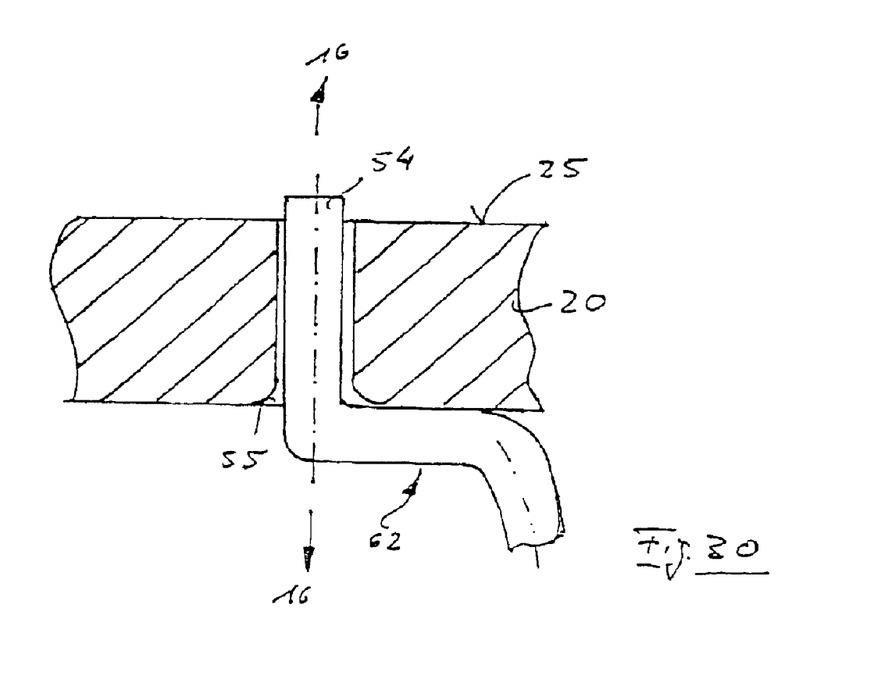
FIG. 30 is a magnified detail X2 as shown in FIG. 29.

Referring now to FIGS. 28 to 30, there is illustrated a further aspect of a contacting device 60 in accordance with the invention. Provided between the upper part 20 and the lower part 21 are contact elements 61 each having two buckle locations 62. The upper buckle location 62 serves to provide support at the upper part 20 and the lower buckle location 62 for support at the lower part 21. The spacing between the buckle locations 62 is larger than the spacing between upper part 20 and lower part 21 in the final mounted position.

Before assembly, the contact elements 61 are oriented between the buckle locations 62 in substantially a straight line from the lower part 21 to the upper part 20. As soon as the upper part 20 is moved into its final position in accordance with the direction of the arrow 16, the contact elements deform elastically into their position 61' as shown in FIG. 29, they then being durably prestressed. In this aspect of the contacting device 60 the upper part 20 serves as the actuator for elastically prestressing the contact elements 61.

In this aspect the upper end 54 protrudes beyond the upper side 25 of the upper part 20, it—the same as in the other aspects of the contacting device 10, 30, 40—being shiftably guided substantially longitudinally in the direction of the arrow 16 in the mount 55.

This aspect of the contacting device 60 makes a simple configuration possible since no additional actuator is needed for prestressing. Instead, the desired prestress of the contact elements 61 is achieved by shifting the upper part 20 relative to the lower part 21 on mounting. For guiding the contact elements 61 and to ensure a defined bending deflection in the a specified direction, a separate component can be provided. This component does not need to be shiftable.

All aspects of the invention permit use of one-part contact elements 11, 51, 61 of very small cross-section. There is no need for a separate guidance, except for the mount 55 in the upper part 20, so that also the spacing between the contact elements 11, 51, 61 can be selected very small. Due to the contact elements 11, 51, 61 being prestressed in accordance with the invention, the desired contact force can now be maintained with high accuracy whilst achieving long life.

What is claimed is:

1. A device for contacting one or more terminals on an electronic component comprising:
   at least one elongated contact element on which a contact force is exerted in a first direction oriented substantially parallel to a longitudinal axis of said contact element; and
   at least one actuator for generating an elastic prestress of said at least one contact element in a second direction oriented substantially perpendicular to said first direction, said at least one actuator having a substantially round cross-section and an outer circumference forming a contact surface area abutting on said at least one contact element, said at least one actuator shiftable in said second direction for altering said prestress, wherein
   each said at least one elongated contact element has a distal end, relative to said device, for receiving the contact force from said one or more terminals.

2. The device as set forth in claim 1, wherein a separate actuator is assigned to each contact element.

3. The device as set forth in claim 1, wherein a common actuator is assigned to a group of contact elements.

4. The device as set forth in claim 1, wherein each of said at least one actuator is arranged substantially at half length of said at least one contact element.

5. The device as set forth in claim 1, wherein each of said at least one contact element has a first end clamped in place non-shiftable and a second end shiftingly guided in a mount for contacting said one or more terminals in said first direction.

6. The device as set forth in claim 5, wherein said each contact element is articulatedly secured at said first end.

7. The device as set forth in claim 5, wherein said mount is tapered towards said second end.

8. A device for contacting one or more terminals on an electronic component comprising:
   at least one elongated contact element on which a contact force is exerted in a first direction oriented substantially parallel to a longitudinal axis of said contact element; and
   at least one actuator for generating an elastic prestress of said at least one contact element in a second direction oriented substantially perpendicular to said first direction, said at least one actuator having a substantially elliptical cross-section and an outer circumference forming a contact surface area abutting on said at least one contact element, said at least one actuator rotatable for altering said prestress, wherein
   each said at least one elongated contact element has a distal end, relative to said device, for receiving the contact force from said one or morn terminals.

9. The device as set forth in claim 8, wherein a separate actuator is assigned to each contact element.

10. The device as set forth in claim 8, wherein a common actuator is assigned to a group of contact elements.

11. The device as set forth in claim 8, wherein each of said at least one actuator is arranged substantially at half length of said at least one contact element.

12. The device as set forth in claim 8, wherein each of said at least one actuator is disposed between a plurality for contacts elements.

13. The device as set forth in claim 8, wherein each of said at least one contact element has a first end clamped in place non-shiftable and a second end shiftingly guided in a mount for contacting said one or more terminals in said first direction.

14. The device as set forth in claim 8, wherein said each contact element is articulatedly secured at said first end.

15. The device as set forth in claim 13, wherein said mount is tapered towards said second end.

16. A device for contacting one or more terminals on an electronic component comprising:
   a plurality of elongated contact elements wherein on at least one said contact element on which a contact force is exerted in a first direction oriented substantially parallel to a longitudinal axis of said at least one contact element; and
   at least one actuator for generating an elastic prestress of said at least one contact element in a second direction oriented substantially perpendicular to said first direction, said actuator having at least one aperture wherein a group of said contact elements protrudes through the same aperture, wherein
   each of said plurality of elongated contact elements has a distal end, relative to said device, for receiving the contact force from said one or more terminals.

17. The device as set forth in claim 16, wherein said at least one contact element has a first end clamped in place non-shiftable and a second end shiftingly guided in a mount for contacting a respective terminal in said first direction.

18. The device as set forth in claim 17, wherein said at least one contact element is articulatedly secured at said first end.

19. The device as set forth in claim 17, wherein said mount is tapered towards said second end.

20. A device for contacting one or more terminals on an electronic component comprising:
   a plurality of contact elements wherein on at least one said contact element on which a contact force is exerted in a first direction oriented substantially parallel to the longitudinal axis of said at least one contact element; and
   at least one actuator for generating an elastic prestress of said at least one contact element in a second direction oriented substantially perpendicular to said first direction, said at least one actuator having a plurality of apertures through which said plurality of contact elements protrudes, wherein each of said apertures is assigned to a single contact element and a shape of said each aperture is adapted to a cross-section of the single contact element assigned thereto, wherein each of said contact elements has a cross-section selected from the group consisting of substantially oval and polygonal and each said aperture shape is selected from the group consisting of an oval, elongated hole, and slit, wherein
   each of said plurality of elongated contact elements has a distal end, relative to said device, for receiving the contact force from said one or more terminals.

21. The device as set forth in claim 20, wherein at least one contact element has a first end clamped in place non-shiftable and a second end shiftingly guided in a mount for contacting a respective terminal in said first direction.

22. The device as set forth in claim 21, wherein at least one contact element is articulatedly secured at said first end.

23. The device as set forth in claim 21, wherein said mount is tapered towards said second end.

24. A method for contacting one or more terminals on an electronic component comprising the following steps:
  a) exerting a contact force on at least one elongated contact element in a first direction oriented substantially parallel to the longitudinal axis of said at least one contact element, said at least one contact element having a first end clamped in place non-shiftable and a second end shiftingly guided in a mount for contacting said terminal of said electronic component in said first direction;
  b) generating a prestress of said at least one contact element in a second direction oriented substantially perpendicular to said first direction prior to contacting, said prestress being altered to move said second end in said first direction;
  c) increasing the prestress to such an extent that said second end is moved under an upper side of said mount;
  d) moving said electronic component into a contacting position on said upper side;
  e) reducing said prestress to such an extent that said second end protrudes beyond said upper side and is urged against said one or more terminals of said component;
  f) increasing said prestress to such an extent that said second end is moved under said upper side; and
  g) removing said electronic component and moving subsequently a further component into said contacting position, wherein
  each said at least one elongated contact element has a distal end for receiving the contact force from said terminal of said electronic component.

* * * * *